(12) United States Patent
Ooyabu et al.

(10) Patent No.: US 8,916,893 B2
(45) Date of Patent: Dec. 23, 2014

(54) LIGHT-EMITTING DEVICE

(75) Inventors: Yasunari Ooyabu, Osaka (JP);
Toshitaka Nakamura, Osaka (JP);
Hironaka Fujii, Osaka (JP); Hisataka Ito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 1 day.

(21) Appl. No.: 13/192,928

(22) Filed: Jul. 28, 2011

(65) Prior Publication Data
US 2012/0032219 A1 Feb. 9, 2012

(30) Foreign Application Priority Data

Aug. 3, 2010 (JP) ................... 2010-174477

(51) Int. Cl.
*H01L 33/00* (2010.01)
*H01L 33/50* (2010.01)
(Continued)

(52) U.S. Cl.
CPC .............. *H01L 33/504* (2013.01); *B82Y 30/00* (2013.01); *C04B 35/44* (2013.01); *C04B 35/6455* (2013.01); *C09K 11/0883* (2013.01);
(Continued)

(58) Field of Classification Search
CPC ................................. H01L 33/60; H01L 33/20
USPC ........................................ 257/98, 99, E33.068
See application file for complete search history.

(56) References Cited

U.S. PATENT DOCUMENTS

2007/0210326 A1   9/2007   Kurihara
2007/0257597 A1  11/2007   Sakata et al.
(Continued)

FOREIGN PATENT DOCUMENTS

JP    2007-036042    2/2007
JP    2007-173397    7/2007
(Continued)

OTHER PUBLICATIONS

Notification of Reasons for Refusal issued in corresponding JP Application No. 2010-174477, dated Aug. 6, 2013.
(Continued)

*Primary Examiner* — Dale E Page
(74) *Attorney, Agent, or Firm* — Sughrue Mion, PLLC

(57) ABSTRACT

A light-emitting device includes a circuit board to which external electric power is supplied, a light emitting diode that is electrically connected onto the circuit board and emits light based on electric power from the circuit board, a housing provided on the circuit board so as to surround the light emitting diode and so that the upper end portion of the housing is positioned above the upper end portion of the light emitting diode, and a fluorescent laminate provided on the housing. The fluorescent laminate includes a first fluorescent layer that emits fluorescent light and a second fluorescent layer that emits fluorescent light having a wavelength that is longer than that of the first fluorescent layer. The second fluorescent layer is disposed on the housing and the first fluorescent layer is laminated on the second fluorescent layer.

6 Claims, 4 Drawing Sheets

(51) Int. Cl.
*B82Y 30/00* (2011.01)
*C04B 35/44* (2006.01)
*C04B 35/645* (2006.01)
*C09K 11/08* (2006.01)
*C09K 11/61* (2006.01)
*C09K 11/77* (2006.01)
*H01L 33/58* (2010.01)

(52) U.S. Cl.
CPC ........... *C09K 11/615* (2013.01); *C09K 11/7731* (2013.01); *C09K 11/7734* (2013.01); *C09K 11/7774* (2013.01); *H01L 33/507* (2013.01); *C04B 2235/3225* (2013.01); *C04B 2235/3229* (2013.01); *C04B 2235/443* (2013.01); *C04B 2235/5445* (2013.01); *C04B 2235/5454* (2013.01); *C04B 2235/652* (2013.01); *C04B 2235/6562* (2013.01); *C04B 2235/6581* (2013.01); *C04B 2235/6582* (2013.01); *C04B 2235/764* (2013.01); *C04B 2235/9653* (2013.01); *C04B 2235/9661* (2013.01); *H01L 33/505* (2013.01); *H01L 33/58* (2013.01); *Y02B 20/181* (2013.01); *H01L 2224/48091* (2013.01); *H01L 2224/48247* (2013.01); *H01L 2224/45144* (2013.01)
USPC ......................... 257/98; 257/99; 257/E33.068

(56) References Cited

U.S. PATENT DOCUMENTS

| | | | |
|---|---|---|---|
| 2008/0123339 A1* | 5/2008 | Bierhuizen et al. | 362/293 |
| 2008/0211386 A1* | 9/2008 | Choi et al. | 313/503 |
| 2009/0057690 A1* | 3/2009 | Chakraborty | 257/88 |
| 2009/0072710 A1* | 3/2009 | Schmidt et al. | 313/503 |
| 2011/0090696 A1 | 4/2011 | Nagai et al. | |

FOREIGN PATENT DOCUMENTS

| | | |
|---|---|---|
| JP | 2009-528429 A | 8/2009 |
| JP | 2009-534863 A | 9/2009 |
| WO | 2006/064930 A1 | 6/2006 |
| WO | 2007/100824 A2 | 9/2007 |
| WO | 2007/122531 A2 | 11/2007 |
| WO | 2008/105428 A1 | 9/2008 |
| WO | 2009/119034 A1 | 10/2009 |

OTHER PUBLICATIONS

First Office Action dated May 28, 2014 from the State Intellectual Property Office of P.R. China in counterpart Chinese application No. 201110196068.8.

* cited by examiner

5

LIGHT-EMITTING DEVICE

CROSS-REFERENCE TO RELATED APPLICATION

The present application claims priority from Japanese Patent Application No. 2010-174477 filed on Aug. 3, 2010, the contents of which are hereby incorporated by reference into this application.

BACKGROUND OF THE INVENTION

1. Field of the Invention

The present invention relates to a light-emitting device that includes a light emitting diode.

2. Description of Related Art

Conventionally, a white light emitting diode that is capable of obtaining white light by covering a blue light emitting diode with a YAG based phosphor that receives blue light and emits yellow light to color mix the blue light from the blue light emitting diode and the yellow light of the YAG based phosphor has been known.

As a white light emitting diode, for example, a lighting system that includes a radiation source such as a blue light-emitting LED, a first fluorescent material that is arranged on the surface of the radiation source, and a second fluorescent material that is piled up on the surface of the first fluorescent material has been disclosed (ref: for example, Japanese Unexamined Patent Publication No. 2009-534863).

In the lighting system, the second fluorescent material made of a red emitting phosphor powder that receives blue light and emits red light is adhered to the surface of the first fluorescent material made of a polycrystalline ceramic of green/yellow emitting garnet that receives blue light and emits green light or yellow light. By mixing the blue light emitted from the blue light-emitting LED, the green light emitted by the first fluorescent material, and the red light emitted by the second fluorescent material, white light that has a color rendering index that is similar to the "sun-like" spectrum is obtained.

SUMMARY OF THE INVENTION

In the above-described lighting system of Japanese Unexamined Patent Publication No. 2009-534863, white light that is similar to the "sun-like" spectrum is obtained. However, the blue light emitted from the blue light-emitting LED is first changed to green light or yellow light by the first fluorescent material and thereafter, the green light or the yellow light is absorbed into the red phosphor.

Therefore, it is difficult to obtain high color rendering properties.

It is an object of the present invention to provide a light-emitting device that is capable of emitting light whose color rendering properties are adjusted so as to give redness.

A light-emitting device of the present invention includes a circuit board to which external electric power is supplied, a light emitting diode that is electrically connected onto the circuit board and emits light based on electric power from the circuit board, a housing provided on the circuit board so as to surround the light emitting diode and so that the upper end portion of the housing is positioned above the upper end portion of the light emitting diode, and a fluorescent laminate provided on the housing, wherein the fluorescent laminate includes a first fluorescent layer that emits fluorescent light and a second fluorescent layer that emits fluorescent light having a wavelength that is longer than that of the first fluorescent layer, and the second fluorescent layer is disposed on the housing and the first fluorescent layer is laminated on the second fluorescent layer.

In the light-emitting device of the present invention, it is preferable that the first fluorescent layer is made of a phosphor ceramic and the second fluorescent layer is made of a resin in which a phosphor is dispersed.

In the light-emitting device of the present invention, it is preferable that the phosphor is a red phosphor that emits red fluorescent light.

In the light-emitting device of the present invention, it is preferable that the red phosphor is $CaAlSiN_3:Eu$.

In the light-emitting device of the present invention, it is preferable that the red phosphor is $CaS:Eu$ or $K_2MF_6:Mn$ (M represents Si, Ge, Sn, and/or Ti).

According to the light-emitting device of the present invention, the second fluorescent layer that emits fluorescent light having a wavelength that is longer than that of the first fluorescent layer is disposed on the housing and the first fluorescent layer that emits fluorescent light is laminated on the second fluorescent layer.

Therefore, light whose color rendering properties are adjusted so as to give redness can be emitted.

DETAILED DESCRIPTION OF THE INVENTION

Figure 1:
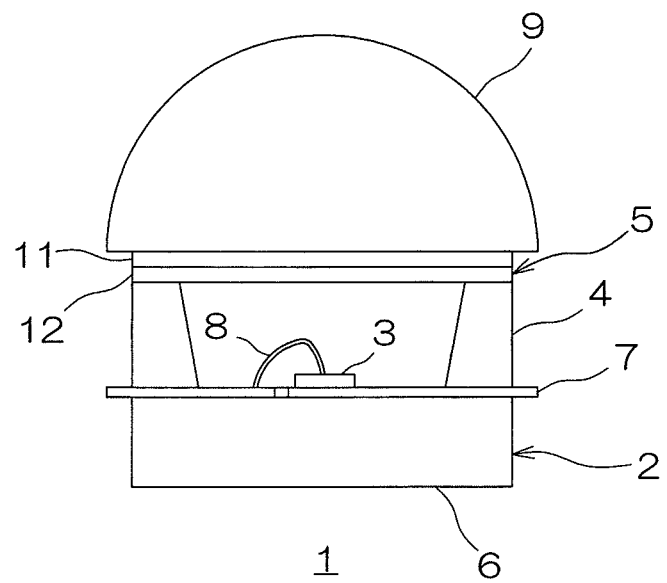
FIG. 1 shows a sectional view of an embodiment of a light-emitting device of the present invention.

FIG. 1 shows a sectional view of an embodiment of a light-emitting device of the present invention.

As shown in FIG. 1, a light-emitting device 1 includes a circuit board 2, a light emitting diode 3, a housing 4, and a fluorescent laminate 5.

The circuit board 2 includes a base board 6 and a wiring pattern 7 that is formed on the upper surface of the base board 6. External electric power is supplied to the circuit board 2, to be specific, the wiring pattern 7.

The base board 6 is formed into a generally rectangular flat plate shape in plane view and is formed from, for example, a metal such as aluminum, a ceramic such as alumina, a polyimide resin, and the like.

The wiring pattern 7 electrically connects a terminal of the light emitting diode 3 to a terminal (not shown) of a power source (not shown) for supplying electric power to the light emitting diode 3. The wiring pattern 7 is formed from a conductive material such as copper, iron, and the like.

The light emitting diode 3 is, to be specific, a blue light emitting diode and is provided on the base board 6. The light emitting diode 3 is electrically connected (wire bonded) to the wiring pattern 7 via a wire 8. The light emitting diode 3 emits light based on electric power from the circuit board 2.

The housing 4 is provided to stand upward from the upper surface of the base board 6 so that the upper end portion of the housing 4 is positioned above the upper end portion of the light emitting diode 3. The housing 4 is formed into a frame shape so as to surround the light emitting diode 3 in plane view.

The housing 4 is formed from, for example, a resin added with a filler, or a ceramic. The reflectance of the housing 4 with respect to the light from the light emitting diode 3 is set to be, for example, 70% or more, or preferably 90% or more, or more preferably 95% or more.

The housing 4 can also be formed as a circuit board with a housing by integrally forming the housing 4 with the circuit board 2 in advance. As a circuit board with a housing, a commercially available product is available. For example, a ceramic multilayer board with cavity (part number: 207806, manufactured by Sumitomo Metal (SMI) Electronics Devices Inc.) is used.

In addition, a sealant such as a silicone resin is filled in the housing 4 as required.

The fluorescent laminate 5 is provided on the housing 4 so as to seal the upper end portion thereof and is adhered thereto via the sealant (or an adhesive) in the housing 4. The fluorescent laminate 5 includes a first fluorescent layer 11 and a second fluorescent layer 12, and receives the light from the light emitting diode 3 to emit fluorescent light. The second fluorescent layer 12 emits fluorescent light having a wavelength that is longer than that of the first fluorescent layer 11 and is disposed on the housing 4. The first fluorescent layer 11 is laminated on the second fluorescent layer 12.

A lens 9 having a generally semi-sphere shape (generally dome shape) can be provided on the housing 4 so as to cover the fluorescent laminate 5 as required. The lens 9 is formed from, for example, a transparent resin such as a silicone resin and the like.

To produce the light-emitting device 1, the housing 4 is first provided on the circuit board 2. Next, the light emitting diode 3 is provided in the housing 4 and the light emitting diode 3 is electrically connected to the circuit board 2 with the wire 8.

Next, the inside of the housing 4 is filled with the sealant as required and the fluorescent laminate 5 is provided on the housing 4 via an adhesive as required so that the second fluorescent layer 12 is disposed on the housing 4 and the first fluorescent layer 11 is laminated on the second fluorescent layer 12.

Finally, the lens 9 is provided on the fluorescent laminate 5 via an adhesive as required to complete the production of the light-emitting device 1.

A heat sink (not shown) is provided on the back surface of the base board 6 as required.

Figure 2:
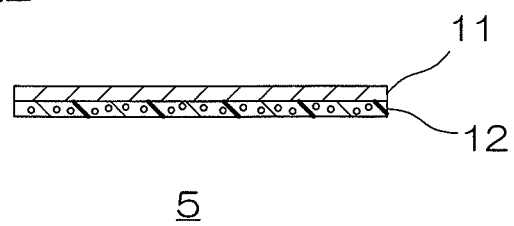
FIG. 2 shows a sectional view of a fluorescent laminate provided on the light-emitting device shown in FIG. 1.
Figure 3:
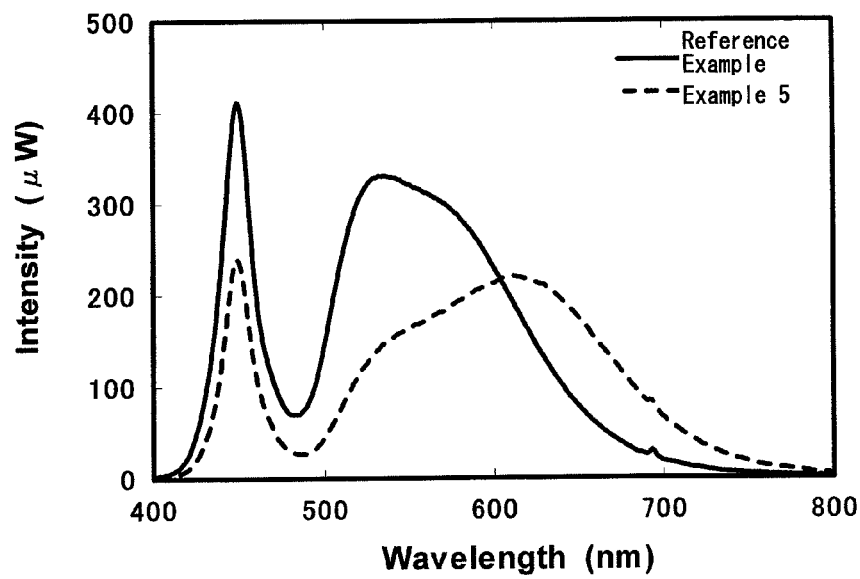
FIG. 3 shows an emission spectrum of Reference Example and Example 5 of the light-emitting device.
Figure 4:
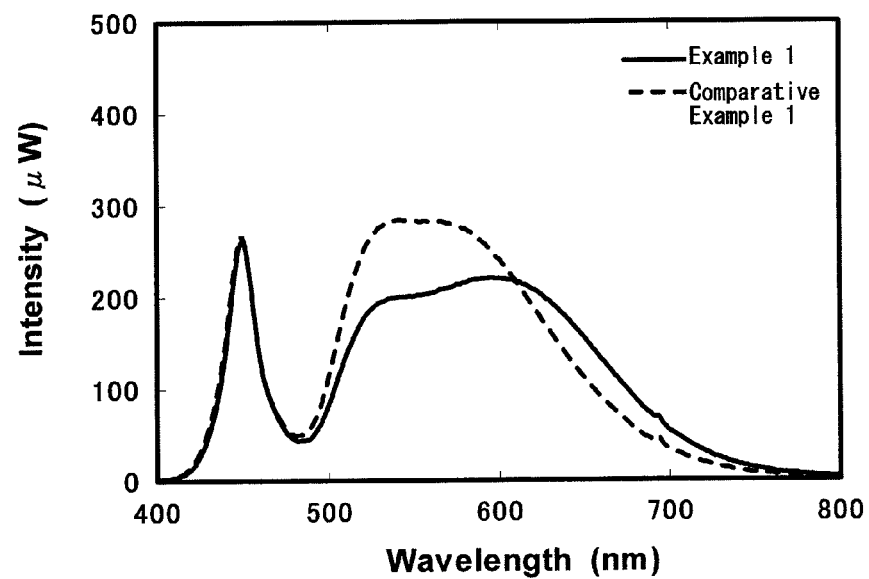
FIG. 4 shows an emission spectrum of Example 1 and Comparative Example 1 of the light-emitting device.
Figure 5:
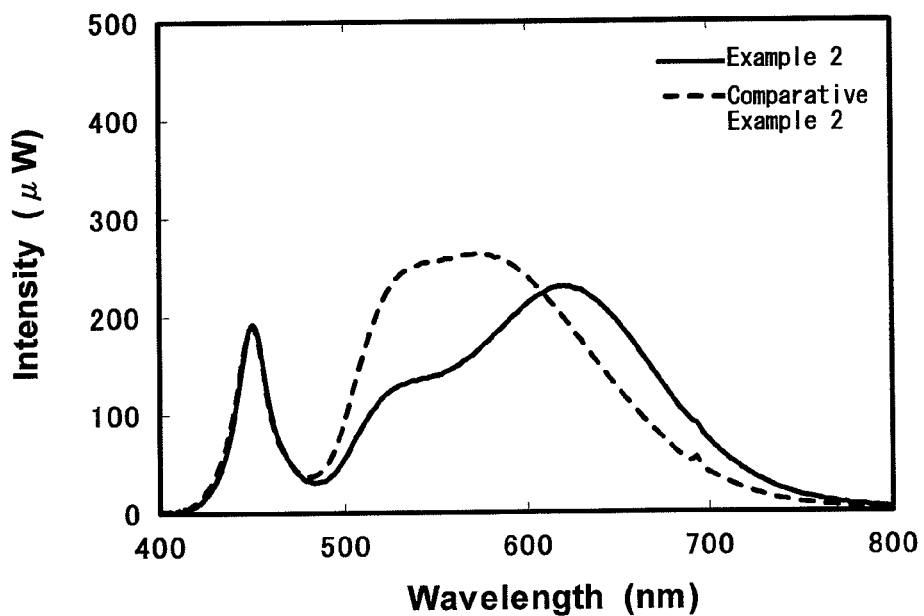
FIG. 5 shows an emission spectrum of Example 2 and Comparative Example 2 of the light-emitting device.
Figure 6:
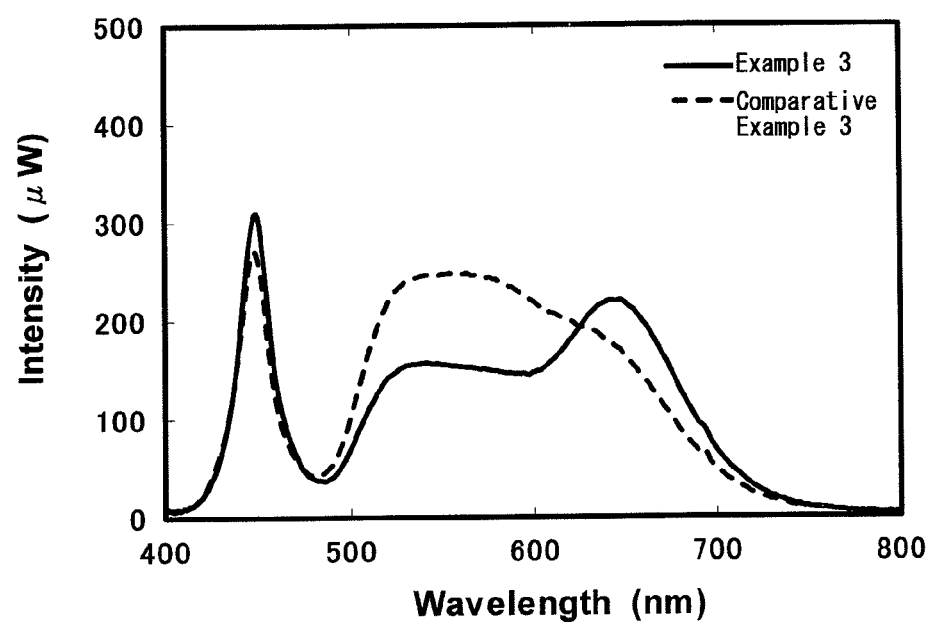
FIG. 6 shows an emission spectrum of Example 3 and Comparative Example 3 of the light-emitting device.
Figure 7:
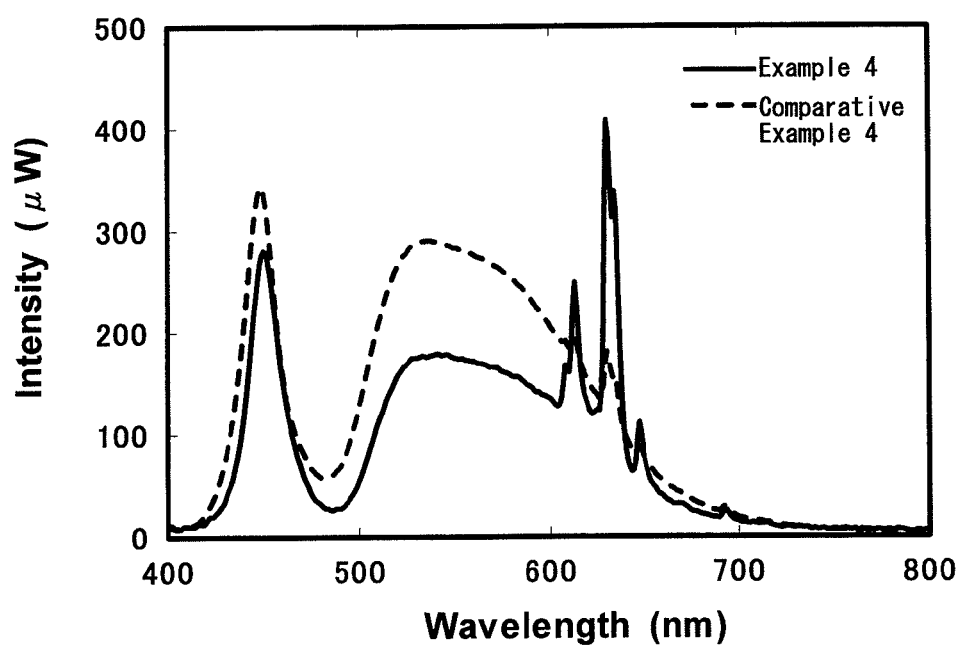
FIG. 7 shows an emission spectrum of Example 4 and Comparative Example 4 of the light-emitting device.

FIG. 2 shows a sectional view of a fluorescent laminate provided on the light-emitting device shown in FIG. 1.

Next, the fluorescent laminate 5 is described in details. In the following, in the description of the fluorescent laminate 5, when referring to the direction, the upper side of the paper surface is referred to as the upper side and the lower side of the paper surface is referred to as the lower side, on the basis of the state in which the fluorescent laminate 5 is mounted on the light-emitting device 1.

The first fluorescent layer 11 is made of a phosphor ceramic and emits fluorescent light whose wavelength is longer than that of an exciting light, for example, in the range of 500 to 650 nm (green light, yellow light, orange light) that is excited by absorbing a part or all of the light whose wavelength is in the range of 350 to 480 nm (near-ultraviolet radiation, blue light) as the exciting light.

An example of the phosphor ceramic for forming the first fluorescent layer 11 includes a phosphor ceramic obtained by doping a metal atom such as cerium (Ce) or europium (Eu) into a base material such as a metal oxide. When the base material is a metal oxide, it can be easily calcined, so that a dense ceramic can be obtained.

To be specific, examples of the phosphor ceramic include garnet type phosphor ceramic having a garnet type crystal structure such as $Y_3Al_5O_{12}$:Ce (YAG (yttrium aluminum garnet):Ce) (fluorescent color:yellow), $(Y, Gd)_3Al_5O_{12}$:Ce (fluorescent color:yellow), $Tb_3Al_5O_{12}$:Ce (fluorescent color:yellow), $Lu_3Al_5O_{12}$:Ce (fluorescent color:green), $Y_3(Al, Ga)_5O_{12}$:Ce (fluorescent color:green), $Ca_3Sc_2Si_3O_{12}$:Ce (fluorescent color:green), and $Lu_2CaMg_2(Si, Ge)_3O_{12}$:Ce (fluorescent color:orange); and silicate phosphor ceramic such as $(Sr, Ba)_2SiO_4$:Eu, $Ca_3SiO_4Cl_2$:Eu, $Sr_3SiO_5$:Eu, $Li_2SrSiO_4$:Eu, and $Ca_3Si_2O_7$:Eu. Preferably, garnet type phosphor ceramic is used, or more preferably, $Y_3Al_5O_{12}$:Ce is used.

In the phosphor ceramic, the chromogenic characteristics can be prepared by adjusting its composition and the doping amount of the metal atom and the like.

The second fluorescent layer 12 is made of a resin in which particles of the phosphor that emits fluorescent light having a wavelength that is longer than that of the first fluorescent layer 11 are dispersed.

Examples of the phosphor include a phosphor that has the same composition as that of the above-described phosphor ceramic and a red phosphor that emits red fluorescent light. The red phosphor is preferably used.

Examples of the red phosphor include nitride phosphor such as $CaAlSiN_3$:Eu, $(Ca, Sr)AlSiN_3$:Eu, $Ca_2Si_5N_8$:Eu, and $(Ca, Sr)_2Si_5N_8$:Eu; sulfide phosphor such as CaS:Eu; oxide phosphor such as $(Sr, Ba)_3SiO_5$:Eu; and fluoride phosphor such as $K_2MF_6$:Mn (M represents Si, Ge, Sn, and/or Ti). Preferably, nitride phosphor, sulfide phosphor, and fluoride phosphor are used, or more preferably, $CaAlSiN_3$:Eu, CaS:Eu, and $K_2MF_6$:Mn (M represents any one of Si, Ge, Sn, and Ti) are used.

$K_2SiF_6$:Mn can be prepared by the method (method of etching a silicon wafer by using a $HF/H_2O/KMnO_4$ solution) described in Journal of Applied Physics (Volume 104, 023512 (2008)).

The average particle size of the phosphor is in the range of, for example, 0.1 to 50 μm, or preferably 0.5 to 10 μm.

The emission wavelength of the phosphor is in the range of, for example, 590 to 650 nm, or preferably 610 to 640 nm.

A resin that can be used has thermal resistance that does not allow deformation or melting at the time of driving the light-emitting device 1 without particular limitation. Examples of the resin include epoxy resin, silicone resin, and acrylic resin. A silicone resin is preferably used.

A preferable example of the silicone resin includes a silicone resin that is capable of forming a semi-cured state. Examples thereof include condensation reaction type silicone resin and addition reaction type silicone resin.

In addition, a preferable example of the silicone resin includes a curable silicone resin in multiple steps in which the curing is completed by the reaction in two or more steps. When the silicone resin is a curable silicone resin in multiple steps, the silicone resin is allowed to be in a semi-cured state at relatively low temperature and by further being heated, the curing reaction can be ended.

An example of the curable silicone resin in multiple steps includes a thermosetting resin composition that contains both-ends silanol type silicone resin, silicon compound containing alkenyl group, organohydrogensiloxane, condensation catalyst, and hydrosilylation catalyst.

To produce the fluorescent laminate 5, the first fluorescent layer 11 is first produced.

To produce the first fluorescent layer 11, particles for the fluorescent layer for forming the first fluorescent layer 11 are produced.

To produce the particles for the fluorescent layer, when $Y_3Al_5O_{12}$:Ce is formed as a phosphor ceramic, for example, an yttrium-containing compound such as yttrium nitrate hexahydrate, an aluminum-containing compound such as aluminum nitrate nonahydrate, and a cerium-containing compound such as cerium nitrate hexahydrate are dissolved in a solvent such as distilled water at a predetermined proportion to prepare a precursor solution.

To prepare the precursor solution, the yttrium-containing compound, the aluminum-containing compound, and the cerium-containing compound are blended to be dissolved in a solvent so that an aluminum atom is in the range of, for example, 120 to 220 moles, or preferably 160 to 180 moles and a cerium atom is in the range of, for example, 0.01 to 2.0 moles, or preferably 0.2 to 1.5 moles with respect to 100 moles of yttrium atom.

Next, precursor particles are obtained by spraying and pyrolyzing the precursor solution. Although the precursor particles can be used as particles for the fluorescent layer as they are, the precursor particles are preferably temporarily calcined at, for example, 1000 to 1400° C., or preferably 1150 to 1300° C., for, for example, 0.5 to 5 hours, or preferably 1 to 2 hours to be prepared as the particles for the fluorescent layer.

When the precursor particles are temporarily calcined, the crystal phase of the obtained particles for the fluorescent layer can be adjusted and therefore, the first fluorescent layer 11 at high density can be obtained.

The average particle size of the obtained particles for the fluorescent layer (measured by a BET (Brunauer-Emmett-Teller) method by using an automatic specific surface area analyzer (manufactured by Micrometritics Instrument Corp., model Gemini 2365)) is in the range of, for example, 50 to 10000 nm, or preferably 50 to 1000 nm, or more preferably 50 to 500 nm.

When the average particle size of the particles for the fluorescent layer is within the above-described range, the density growth of the first fluorescent layer 11, the improvement of dimensional stability at the time of sintering, and the reduction of void generation can be realized.

As the particles for the fluorescent layer, a mixture made by mixing yttrium-containing particles such as yttrium oxide particles, aluminum-containing particles such as aluminum oxide particles, and cerium-containing particles such as cerium oxide particles also can be used.

In this case, the yttrium-containing particles, the aluminum-containing particles, and the cerium-containing particles are mixed so that an aluminum atom is in the range of, for example, 120 to 220 moles, or preferably 160 to 180 moles and a cerium atom is in the range of, for example, 0.01 to 2.0 moles, or preferably 0.2 to 1.5 moles with respect to 100 moles of yttrium atom.

Next, to produce the first fluorescent layer 11, a ceramic green body that is made of the particles for the fluorescent layer is produced.

To produce the ceramic green body, for example, the particles for the fluorescent layer are subjected to a pressing by using a mold.

At this time, the particles for the fluorescent layer are first dispersed into a solvent having volatility such as an aromatic solvent including xylene and an alcohol including methanol by appropriately using an additive such as a binder resin, dispersant, plasticizer and sintering additive to prepare a dispersion liquid of the particles for the fluorescent layer. Next, the dispersion liquid of the particles for the fluorescent layer is dried to prepare a powder that contains the particles for the fluorescent layer and the additive. Subsequently, the powder can be subjected to the pressing.

To disperse the particles for the fluorescent layer into the solvent, other than the above-described additive, an additive that can be decomposed by heating can be used without particular limitation and a known additive can be used.

A method for dispersing the particles for the fluorescent layer into the solvent includes wet-blending by using a known dispersing device such as a mortar, a variety of mixers, a ball mill, or a bead mill.

The ceramic green body is produced as follows: the dispersion liquid of the particles for the fluorescent layer is subjected to viscosity control as required, and then is tape casted, for example, by using a doctor blade method and the like, or is extruded and molded on a resin substrate such as a PET film to be dried. When the doctor blade method is used, the thickness of each of the ceramic green bodies is controlled by adjusting a gap of the doctor blade.

When an additive such as a binder resin is blended into the dispersion liquid of the particles for the fluorescent layer, the ceramic green body is heated in the air at, for example, 400 to 800° C. for, for example, 1 to 10 hours to perform the binder-removing treatment in which the additive is decomposed and removed before the ceramic green body is calcined. At this time, the temperature rising speed is, for example, 0.2 to 2.0° C./min. When the temperature rising speed is within the above-described range, a deformation of the ceramic green body, a crack, and the like can be prevented.

Next, to produce the first fluorescent layer 11, the ceramic green body is calcined.

The calcining temperature, duration, and calcining atmosphere are set appropriately according to the phosphor. When the phosphor is $Y_3Al_5O_{12}$:Ce, it is calcined at, for example, 1500 to 1800° C., or preferably 1650 to 1750° C. for, for example, 0.5 to 24 hours, or preferably 3 to 5 hours, for example, in a vacuum, under an inert gas atmosphere such as argon, or under a reducing gas such as hydrogen and hydrogen/nitrogen mixed gas.

When the ceramic green body is calcined under a reducing atmosphere, carbon particles can be used in combination with a reducing gas. When carbon particles are used in combination, the reducing characteristics can further be improved.

The temperature rising speed up to the calcining temperature is, for example, 0.5 to 20° C./min. When the temperature rising speed is within the above-described range, while the temperature is capable of efficiently increasing, crystal grains (grains) are grown comparatively moderately and therefore, the void generation can be suppressed. To further realize the density growth and to improve the translucency, the phosphor ceramic is sintered by a hot isostatic pressing sintering method (HIP method) under increased pressure.

The first fluorescent layer 11 is obtained in this manner.

The thickness of the obtained first fluorescent layer 11 is in the range of, for example, 100 to 1000 μm, or preferably 150 to 500 μm.

When the thickness of the first fluorescent layer 11 is within the above-described range, the handling thereof can be improved and damage thereto can be prevented.

The total luminous transmittance (at 700 nm) of the obtained first fluorescent layer 11 is in the range of, for example, 30 to 90%, or preferably 60 to 90%.

The thermal conductivity of the obtained first fluorescent layer 11 is in the range of, for example, ten times or more, or preferably thirty times or more, or more preferably fifty times or more of that of the second fluorescent layer 12. To be specific, the thermal conductivity of the first fluorescent layer 11 is in the range of, for example, 2 W/m·K or more, or preferably 6 W/m·K or more, or more preferably 10 W/m·K or more.

Next, to produce the fluorescent laminate 5, the second fluorescent layer 12 is produced.

To produce the second fluorescent layer 12, a dispersion liquid of a phosphor is prepared by dispersing the phosphor particles into a resin (or a resin solution in which the resin is dissolved into a solvent and the like). Thereafter, the dispersion liquid of the phosphor is applied onto a substrate such as a PET film to be dried and then is cured as required.

To prepare the dispersion liquid of the phosphor, the phosphor particles are blended and mixed at, for example, 10 to 70 mass %, or preferably 20 to 80 mass % with respect to the total amount of the resin (or the resin content in the resin solution) and the phosphor particles.

In the second fluorescent layer 12, a glass material can also be used instead of the resin. In addition, a known additive such as a viscosity-imparting material, a dispersant, and the like can be appropriately added into the dispersion liquid of the phosphor.

When the mixing ratio of the phosphor particles is within the above-described range, the thermal conductivity of the second fluorescent layer 12 can be improved.

Examples of the method for applying the dispersion liquid of the phosphor onto the substrate include a doctor blade method, a gravure coater method, and a fountain coater method.

In particular, when a silicone resin that is capable of forming a semi-cured state is used as the resin, the phosphor particles are first dispersed into the silicone resin to prepare the dispersion liquid of the phosphor.

Next, after the dispersion liquid of the phosphor is applied onto the substrate, the silicone resin is made in a semi-cured state by heating with the temperature and the heating duration that are set to make the silicone resin in a semi-cured state, so that the second fluorescent layer 12 is obtained in a semi-cured state.

The thickness of the obtained second fluorescent layer 12 is in the range of, for example, 200 μm or less, or preferably 100 μm or less, or more preferably 20 to 50 μm.

When the thickness of the second fluorescent layer 12 is within the above-described range, the thermal conductivity can be improved in the thickness direction and the thermal conductivity between the first fluorescent layer 11 and the housing 4 can be improved. In addition, when the second fluorescent layer 12 has sticky, the reduction of sticky can be prevented.

The surface of the obtained second fluorescent layer 12 on the side opposite to the substrate may be protected by a release liner and the like.

Next, to produce the fluorescent laminate 5, the first fluorescent layer 11 and the second fluorescent layer 12 are laminated.

When the second fluorescent layer 12 in a semi-cured state is used, for example, the first fluorescent layer 11 is attached to the second fluorescent layer 12 in a semi-cured state. Thereafter, the second fluorescent layer 12 in a semi-cured state is heated with the temperature and the heating duration for being completely cured to be completely cured.

The fluorescent laminate 5 is obtained in this manner.

The average color rendering index of the obtained fluorescent laminate 5 is in the range of, for example, 80 or more, or preferably 85 or more, or more preferably 90 or more.

The color rendering index of the obtained fluorescent laminate 5 is in the range of, for example, 25 or more, or preferably 50 or more, or more preferably 80 or more.

The color temperature of the obtained fluorescent laminate 5 is in the range of, for example, 2000 to 8000 K, or preferably 3000 to 5000 K.

According to the light-emitting device 1, the second fluorescent layer 12 that emits fluorescent light having a wavelength that is longer than that of the first fluorescent layer 11 is disposed on the housing 4 and the first fluorescent layer 11 that emits fluorescent light is laminated on the second fluorescent layer 12.

Therefore, light whose color rendering properties are adjusted so as to give redness can be emitted.

The calcining temperature of the red phosphor is different from that of the first fluorescent layer 11, in particular, that of the garnet type phosphor ceramic, so that it is difficult to calcine the red phosphor at the same time with the first fluorescent layer 11 and further, there may a case where the luminous efficiency of the red phosphor is reduced due to the oxidation by the calcination.

However, according to the light-emitting device 1, the second fluorescent layer 12 is formed from the resin in which the phosphor particles are dispersed.

Therefore, even when the red phosphor is used in the second fluorescent layer 12, the reduction of the luminous efficiency of the red phosphor can be prevented without calcining the red phosphor.

According to the light-emitting device 1, the first fluorescent layer 11 is made of the phosphor ceramic and the second fluorescent layer 12 is formed from the resin in which the phosphor particles are dispersed with the thickness of 200 μm or less.

Therefore, the heat from the second fluorescent layer 12 can be efficiently transferred to the first fluorescent layer 11 and the heat from the first fluorescent layer 11 can be efficiently transferred to the housing 4 via the end portions of the second fluorescent layer 12 that are in contact with the housing 4.

As a result, the heat dissipation of the fluorescent laminate 5 (the first fluorescent layer 11 and the second fluorescent layer 12) can be improved and the light whose color rendering properties are adjusted so as to give redness can be emitted.

According to the light-emitting device 1, the second fluorescent layer 12 is sandwiched between the first fluorescent layer 11 and the housing 4.

Therefore, it is possible to prevent that the second fluorescent layer 12 comes into contact with the external air. In this way, even when the phosphor that is contained in the second fluorescent layer 12 is CaS:Eu or $K_2MF_6$:Mn (M represents Si, Ge, Sn, and/or Ti) and has poor humidity and heat resistance, it is possible to prevent that the phosphor comes into contact with moisture that is contained in the external air.

As a result, it is possible to prevent deterioration of the phosphor that is contained in the second fluorescent layer 12.

In the above-described embodiment, the first fluorescent layer 11 is obtained as the phosphor ceramic. Alternatively, a phosphor powder dispersing sheet in which a phosphor powder that has the same composition as that of the above-described phosphor ceramic is dispersed into the resin can be used as the first fluorescent layer 11.

To be specific, first, in the same manner as that for producing the above-described second fluorescent layer 12, the phosphor powder that has the same composition as that of the above-described phosphor ceramic is dispersed into the resin, thereby producing the first fluorescent layer 11.

Next, the dispersion liquid of the phosphor for producing the second fluorescent layer 12 is coated on the obtained first fluorescent layer 11 to be heated, so that the second fluorescent layer 12 in a semi-cured state is obtained.

Thereafter, the second fluorescent layer 12 in a semi-cured state is cured, so that the fluorescent laminate 5 in which the first fluorescent layer 11 and the second fluorescent layer 12 are laminated is obtained.

As described above, the obtained fluorescent laminate 5 is provided on the housing 4, thereby producing the light-emitting device 1.

In the above-described embodiment, the light-emitting device 1 that has one light emitting diode 3 is shown. Alternatively, the number of the light emitting diode 3 provided on the light-emitting device 1 is not particularly limited and the light-emitting device 1 can be formed, for example, in a state of array in which a plurality of the light emitting diodes 3 are arranged planarly (two-dimensionally) or linearly (one-dimensionally).

In the above-described embodiment, the lens 9 having a semi-sphere shape is provided on the fluorescent laminate 5. Alternatively, for example, a micro-lens array sheet or a diffusing sheet can also be provided instead of the lens 9.

The light-emitting device 1 is preferably used as a power LED light source that requires high brightness and high output power, such as a back light of a large-scale liquid crystal screen, a variety of lighting equipments, a headlight of a car, an advertising sign, a flash for a digital camera, and the like.

EXAMPLES

While in the following, the present invention is described based on Examples and Comparative Examples, the present invention is not limited to any of them by no means.

1. Production of First Fluorescent Layer (1) Production of Particles for Fluorescent Layer The components described below were dissolved in 250 ml of distilled water to prepare 0.4 M of a precursor solution. The details of the components were as follows: 14.345 g (0.14981 mol) of yttrium nitrate hexahydrate, 23.45 g (0.25 mol) of aluminum nitrate nonahydrate, and 0.02 g (0.00019 mol) of cerium nitrate hexahydrate.

The precursor solution was sprayed and pyrolyzed at a speed of 10 ml/min in RF induction plasma flame by using a two-fluid nozzle to obtain precursor particles.

The crystal phase of the obtained precursor particles was a mixed phase of amorphous and YAP (yttrium aluminum perovskite, $YAlO_3$) crystal when analyzed by an X-ray diffraction method.

The average particle size of the obtained precursor particles (measured by a BET (Brunauer-Emmett-Teller) method by using an automatic specific surface area analyzer (manufactured by Micrometritics Instrument Corp., model Gemini 2365)) was about 75 nm.

Next, the obtained precursor particles were put in a crucible made of alumina and were temporarily calcined at 1200° C. for two hours in an electric furnace to obtain particles for the fluorescent layer.

The crystal phase of the obtained particles for the fluorescent layer was a single phase of YAG (yttrium aluminum garnet) crystal.

The average particle size of the obtained particles for the fluorescent layer was about 95 nm.

(2) Preparation of Dispersion Liquid of Particles for Fluorescent Layer 4 g of the obtained particles for the fluorescent layer, 0.21 g of PVB (poly(vinyl butyral-co-vinyl alcohol-co-vinyl acetate) as a binder resin, 0.012 g of silica powder (manufactured by Cabot Corporation) as a sintering additive, and 10 ml of methanol as a solvent were mixed in a mortar.

In this way, a dispersion liquid of the particles for the fluorescent layer in which the particles for the fluorescent layer were dispersed was prepared.

(3) Production of Ceramic Green Body

The obtained dispersion liquid of the particles for the fluorescent layer was dried with a dryer, so that a powder was obtained. 140 mg of the powder was filled in a uniaxial press mold with 13 mmφ and then was subjected to application of pressure with a load of about 20 kN with a hydraulic pressing machine, so that a ceramic green body in a disk shape with a thickness of about 350 μm was obtained.

(4) Calcination of Ceramic Green Body

The obtained ceramic green body was heated up to 800° C. at the temperature rising speed of 2° C./min in the air in a tube electric furnace made of alumina to perform the binder-removing treatment in which an organic component such as a binder resin was decomposed and removed.

Thereafter, the inside of the tube electric furnace made of alumina was evacuated with a rotary pump and then the ceramic green body was calcined at 1500° C. for five hours, so that the first fluorescent layer (as described in YAG:Ce) was obtained as a phosphor ceramic.

The thickness of the obtained first fluorescent layer was 283 μm.

The total luminous transmittance (at 700 nm) of the obtained first fluorescent layer was 62%. A method for measuring the total luminous transmittance is shown in the following.

<Total Luminous Transmittance Measurement of First Fluorescent Layer>

A multi channel photo detector (manufactured by Otsuka Electronics Co., Ltd., MCPD 7000) and a transmittance measurement stage (manufactured by Otsuka Electronics Co., Ltd.) provided with an integrating sphere were connected by using a specialized optical fiber to measure the total luminous transmittance in the range of wavelength of 380 nm to 1000 nm.

To be specific, the spot size of the incident light at the time of measurement was adjusted to about 2 mmφ to allow the transmittance in a state where the first fluorescent layer was not provided to be 100% and the total luminous transmittance of the first fluorescent layer was measured.

The total luminous transmittance showed a wavelength dependence with the absorption of the first fluorescent layer. However, as an indicator to evaluate transparency (diffusivity), the value of wavelength of 700 nm that was not absorbed in the first fluorescent layer (YAG:Ce) was used.

2. Production of Second Fluorescent Layer

Production Example 1

A dispersion liquid of a phosphor with a phosphor concentration of 20 mass % in which 0.6 g of a red nitride phosphor ($CaAlSiN_3$:Eu, manufactured by Intematix., part number: R6535, emission peak wavelength: 640 nm, average particle size: 15.5 μm) was added into 2.4 g of a thermosetting silicone elastomer resin (manufactured by Shin-Etsu Chemical Co., Ltd., part number: KER-2500) was produced. The dispersion liquid of the phosphor was coated on a PET film having a thickness of 80 μm with a coating thickness of about 38 μm by using an applicator and was heated to be in a semi-cured state, so that a second fluorescent layer (as described in $CaAlSiN_3$: Eu Red powder (20 wt %)) was obtained.

Production Example 2

The second fluorescent layer (as described in $CaAlSiN_3$:Eu Red powder (35 wt %)) was obtained in the same manner as in Production Example 1 except that the dispersion liquid of the phosphor with a phosphor concentration of 35 mass % was produced with a mixing amount of the red nitride phosphor 1.292 g and the dispersion liquid of the phosphor was coated on a PET film with a coating thickness of about 40 μm.

Production Example 3

A dispersion liquid of a phosphor with a phosphor concentration of 10 mass % in which 0.27 g of a red sulfide phosphor (CaS:Eu, average particle size: 11 μm) was added into 2.4 g of a thermosetting silicone elastomer resin (manufactured by Shin-Etsu Chemical Co., Ltd., part number: KER-2500) was produced. The dispersion liquid of the phosphor was coated on a PET film having a thickness of 80 μm with a coating thickness of about 45 μm by using an applicator and was heated to be in a semi-cured state, so that a second fluorescent layer (as described in CaS:Eu Red powder (10 wt %)) was obtained.

Production Example 4

A dispersion liquid of a phosphor with a phosphor concentration of 60 mass % in which 3.6 g of a red fluoride phosphor ($K_2SiF_6$:Mn) was added into 2.4 g of a thermosetting silicone elastomer resin (manufactured by Shin-Etsu Chemical Co., Ltd., part number: KER-2500) was produced. $K_2SiF_6$:Mn was prepared by the method (method of etching a silicon wafer by using a $HF/H_2O/KMnO_4$ solution) described in Journal of Applied Physics (Volume 104, 023512 (2008)). The dispersion liquid of the phosphor was coated on a PET film having a thickness of 80 μm with a coating thickness of about 175 μm by using an applicator and was heated to be in a semi-cured state, so that a second fluorescent layer (as described in $K_2SiF_6$:Mn Red powder (60 wt %)) was obtained.

3. Production of Fluorescent Laminate

Each of the first fluorescent layers was attached onto the respective second fluorescent layers in each Production Examples and the silicone elastomer resin was cured by being heated at 100° C. for one hour and then at 150° C. for one hour.

Thereafter, the second fluorescent layer was cut in with a razor in accordance with the size of the first fluorescent layer (3.5 mm×2.8 mm) and then the second fluorescent layer was peeled off from the PET film, so that a fluorescent laminate in which the first fluorescent layer and the second fluorescent layer were laminated was obtained.

4. Production of Light Emitting Diode Device for Evaluation

Example 1

A blue light emitting diode chip (manufactured by Cree, Inc., part number: C450EZ1000-0123, 980 μm×980 μm×100 μm) was die attached by Au—Sn solder in a cavity of a ceramic multilayer board with cavity (manufactured by Sumitomo Metal (SMI) Electronics Devices Inc., part number: 207806, outer size: 3.5 mm×2.8 mm, cavity: generally elliptical shape of 2.68 mm in the long axis direction, 1.98 mm in the short axis direction, and 0.6 mmt in height) to produce a light emitting diode package mounted with one blue light emitting diode chip by wire bonding from an electrode of the light emitting diode chip to a lead frame of the ceramic multilayer board by an Au wire.

A gel-like silicone resin was filled in the cavity and the gel-like silicone resin was applied onto the upper end portion of the cavity. Subsequently, the fluorescent laminate in which the second fluorescent layer was laminated obtained in Production Example 1 was provided on the cavity via the gel-like silicone resin with the second fluorescent layer placed on the lower side. Thereafter, the gel-like silicone resin was heated at 100° C. for fifteen minutes to be cured, thereby producing a light-emitting device.

A small amount of solder paste (product name: Chip Quik, part number: SMD291SNL) was applied to a solder pad provided on the bottom portion of the ceramic multilayer board. The applied one was disposed according to the electrode pattern of a commercially available star-shaped aluminum board (manufactured by The Bergquist Company, product name: Thermal Clad, part number: 803291) and the light-emitting device was soldered to the star-shaped aluminum board by reflowing the solder paste at 260° C.

Furthermore, the back surface of the star-shaped aluminum board was thinly applied with a thermal conductive grease (manufactured by ITW Chemtronics, part number: CT40-5) and was attached to a heat sink (manufactured by Wakefield Thermal Solutions, Inc., part number: 882-50AB) made of aluminum via the above-described grease.

Example 2

A light-emitting device was produced in the same manner as in Example 1 except that the fluorescent laminate in which the second fluorescent layer was laminated obtained in Production Example 2 was provided on the cavity with the second fluorescent layer placed on the lower side.

Example 3

A light-emitting device was produced in the same manner as in Example 1 except that the fluorescent laminate in which the second fluorescent layer was laminated obtained in Production Example 3 was provided on the cavity with the second fluorescent layer placed on the lower side.

Example 4

A light-emitting device was produced in the same manner as in Example 1 except that the fluorescent laminate in which the second fluorescent layer was laminated obtained in Production Example 4 was provided on the cavity with the second fluorescent layer placed on the lower side.

Example 5

A dispersion liquid of a phosphor with a phosphor concentration of 60 mass % in which 3.6 g of a yellow YAG:Ce phosphor powder (manufactured by PhosphorTech Corporation, part number: BYW01A, average particle size: 9 μm) was added into 2.4 g of a thermosetting silicone elastomer resin (manufactured by Shin-Etsu Chemical Co., Ltd., part number: KER-2500) was produced. The dispersion liquid of the phosphor was coated on a PET film having a thickness of 80 μm with a coating thickness of about 45 μm by using an applicator to be heated at 150° C. for one hour, so that a YAG powder dispersing sheet in which a YAG:Ce phosphor was dispersed was obtained as the first fluorescent layer.

Next, the dispersion liquid of the red phosphor prepared in Production Example 1 was coated on the first fluorescent layer (YAG powder dispersing sheet) with a coating thickness of about 55 μm by using an applicator in the same manner as the description above and was heated to be in a semi-cured state, so that a second fluorescent layer was obtained.

Thereafter, the thermosetting silicone elastomer resin was cured by being heated at 100° C. for one hour and then at 150° C. for one hour, so that a fluorescent laminate in which the first fluorescent layer and the second fluorescent layer were laminated was obtained.

The obtained fluorescent laminate was provided on the cavity in the same manner as in Example 1, thereby producing a light-emitting device.

Comparative Example 1

A light-emitting device was produced in the same manner as in Example 1 except that the fluorescent laminate in which the second fluorescent layer was laminated obtained in Production Example 1 was provided on the cavity with the second fluorescent layer placed on the upper side.

Comparative Example 2

A light-emitting device was produced in the same manner as in Example 1 except that the fluorescent laminate in which the second fluorescent layer was laminated obtained in Production Example 2 was provided on the cavity with the second fluorescent layer placed on the upper side.

Comparative Example 3

A light-emitting device was produced in the same manner as in Example 1 except that the fluorescent laminate in which the second fluorescent layer was laminated obtained in Production Example 3 was provided on the cavity with the second fluorescent layer placed on the upper side.

Comparative Example 4

A light-emitting device was produced in the same manner as in Example 1 except that the fluorescent laminate in which the second fluorescent layer was laminated obtained in Production Example 4 was provided on the cavity with the second fluorescent layer placed on the upper side.

Reference Example

A light-emitting device was produced in the same manner as in Example 1 except that the first fluorescent layer alone was provided on the cavity.

5. Evaluation (1) Measurement of Light-emitting Characteristics in Light-emitting Device A multi channel photo detector (manufactured by Otsuka Electronics Co., Ltd., MCPD 7000) and an integrating sphere whose inner diameter was 12 inches were connected to each other by using a specialized optical fiber to measure the emission spectrum of the light-emitting device in the range of wavelength of 380 nm to 1000 nm.

To be specific, each of the light-emitting devices obtained in each of Examples, each of Comparative Examples, and Reference Example was placed at the center inside of the integrating sphere and a direct current of 100 mA was applied to the light emitting diode to be lit up. The emission spectrum was recorded more than 10 seconds later after the electric power supply for performance stabilization of the light emitting diode (ref: FIGS. 3 to 7). The values of radiation intensity (mW), luminous efficiency (lm/W), CIE chromaticity (x, y), average color rendering index Ra, color rendering index R9, and color temperature (K) of the light-emitting device were calculated from the obtained emission spectrum. The results are shown in Table 1.

(2) Temperature Measurement of Surface of Fluorescent Laminate

The temperature of the fluorescent laminate, when applying an electric current of 1 A to the light emitting diode of the light-emitting devices obtained in each of Examples, each of Comparative Examples, and Reference Example, was measured by using an infrared camera (manufactured by FLIR Systems, Inc., product name: Infrared Camera A325). The results are shown in Table 1.

TABLE 1

| | Laminating Structure of Fluorescent Laminate Lower Side/Upper side | CIE Chromaticity (x, y) | Color Temperature (K) | Color Rendering Index Ra, R9 | Radiation Intensity (mW) | Luminous Efficiency (lm/W) | Surface Temperature (° C.) |
|---|---|---|---|---|---|---|---|
| Example 1 | $CaAlSiN_3$: Eu Red Powder (20 wt %)/YAG-CP | 0.38, 0.38 | 3979 | 83.3, 31.6 | 43.9 | 47.0 | 77.1 |
| Example 2 | $CaAlSiN_3$: Eu Red Powder (35 wt %)/YAG-CP | 0.42, 0.37 | 2985 | 91.7, 65.4 | 40.0 | 37.9 | 76.6 |
| Example 3 | CaS: Eu Red Powder (10 wt %)/YAG-CP | 0.36, 0.34 | 4207 | 88.9, 72.8 | 42.4 | 35.5 | 78.5 |
| Example 4 | $K_2SiF_6$: Mn Red Powder (60 wt %)/YAG-CP | 0.36, 0.37 | 4492 | 79.7, 19.7 | 34.4 | 36.7 | 77.4 |
| Example 5 | $CaAlSiN_3$: Eu Red Powder (20 wt %)/ YAG: Ce Powder (60 wt %) | 0.41, 0.37 | 3242 | 88.2, 51.2 | 40.5 | 38.7 | 322.0 |
| Comparative Example 1 | YAG-CP/$CaAlSiN_3$: Eu Red Powder (20 wt %) | 0.37, 0.42 | 4588 | 69.9, −46.0 | 47.5 | 59.3 | 79.1 |
| Comparative Example 2 | YAG-CP/$CaAlSiN_3$: Eu Red Powder (35 wt %) | 0.39, 0.43 | 4081 | 71.7, −31.4 | 44.2 | 55.0 | 76.1 |
| Comparative Example 3 | YAG-CP/CaS: Eu Red Powder (10 wt %) | 0.37, 0.40 | 4340 | 75.5, −3.7 | 48.0 | 51.8 | 79.4 |
| Comparative Example 4 | YAG-CP/$K_2SiF_6$: Mn Red Powder (60 wt %) | 0.34, 0.40 | 5296 | 63.9, −60.2 | 46.9 | 55.9 | 80.1 |
| Reference Example | YAG-CP | 0.33, 0.39 | 5620 | 66.1, −78.5 | 51.9 | 64.7 | 69.8 |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A light-emitting device comprising:

a circuit board to which external electric power is supplied;

a light emitting diode that is electrically connected onto the circuit board and emits light based on electric power from the circuit board;

a housing formed into a frame shape, wherein an upper part of the frame shape is open, and the housing is provided on the circuit board so as to surround the light emitting diode without being in contact therewith and so that the upper end portion of the housing is positioned above the upper end portion of the light emitting diode;

a fluorescent laminate provided on the housing so as to be spaced apart from the light emitting diode, and a sealant filled in the housing, wherein the fluorescent laminate includes a first fluorescent layer that emits fluorescent light and a second fluorescent layer that emits fluorescent light having a wavelength that is longer than that of the first fluorescent layer, and the second fluorescent layer is made of a resin in which a phosphor is dispersed and disposed on the housing so as to be spaced apart from the light emitting diode and to be in contact with the sealant, the first fluorescent layer is made of a phosphor ceramic and laminated on the second fluorescent layer, the first fluorescent layer has a thickness of 100 to 500 μm, and the second fluorescent layer has a thickness of 20 to 50 μm.

2. The light-emitting device according to claim 1, wherein the phosphor is a red phosphor that emits red fluorescent light.

3. The light-emitting device according to claim 2, wherein the red phosphor is $CaAlSiN_3$:Eu.

4. The light-emitting device according to claim 2, wherein the red phosphor is CaS:Eu or $K_2MF_6$:Mn (M represents Si, Ge, Sn, and/or Ti).

5. The light-emitting device according to claim 1, wherein the fluorescent laminate is adhered to the upper end portion of the housing via the sealant.

6. The light-emitting device according to claim 1, wherein the fluorescent laminate is adhered to the upper end portion of the housing via an adhesive.

* * * * *